(12) United States Patent
Yu

(10) Patent No.: US 6,380,104 B1
(45) Date of Patent: Apr. 30, 2002

(54) METHOD FOR FORMING COMPOSITE GATE DIELECTRIC LAYER EQUIVALENT TO SILICON OXIDE GATE DIELECTRIC LAYER

(75) Inventor: Mo-Chiun Yu, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/636,582

(22) Filed: Aug. 10, 2000

(51) Int. Cl.[7] ................ H01L 21/31; H01L 21/469
(52) U.S. Cl. ............... 438/776; 438/775; 438/777; 438/787
(58) Field of Search .................. 438/775, 776, 438/777, 787

(56) References Cited

U.S. PATENT DOCUMENTS

| | | | |
|---|---|---|---|
| 5,712,208 A | | 1/1998 | Tseng et al. ............... 438/770 |
| 5,821,172 A | | 10/1998 | Gilmer et al. ............ 438/769 |
| 5,827,769 A | * | 10/1998 | Aminzadeh et al. ....... 438/305 |
| 5,891,798 A | * | 4/1999 | Doyle et al. ............. 438/624 |
| 5,891,809 A | * | 4/1999 | Chau et al. .............. 438/770 |
| 5,940,736 A | | 8/1999 | Brady et al. ............. 438/787 |
| 6,077,751 A | * | 6/2000 | Marcus et al. ........... 438/308 |
| 6,251,761 B1 | * | 6/2001 | Rodder et al. ........... 438/591 |
| 6,261,973 B1 | * | 7/2001 | Misium et al. .......... 438/775 |

* cited by examiner

Primary Examiner—Alexander G. Ghyka
(74) Attorney, Agent, or Firm—George O. Saile; Stephen B. Ackerman

(57) ABSTRACT

A method for forming upon a semiconductor substrate employed within a microelectronics fabrication a composite gate insulating layer of MOS device comprising a silicon oxide dielectric layer and a high-K dielectric layer. The method employs thermal oxidation of a silicon semiconductor substrate to form an initial silicon oxide dielectric layer. A RPN plasma method is employed to form a layer of silicon nitride high-k dielectric material partly into the silicon oxide dielectric layer. The composite dielectric layer is dielectrically equivalent to the initial silicon oxide dielectric layer, with equivalent performance, reliability and manufacturability of the MOS device.

15 Claims, 1 Drawing Sheet

METHOD FOR FORMING COMPOSITE GATE DIELECTRIC LAYER EQUIVALENT TO SILICON OXIDE GATE DIELECTRIC LAYER

BACKGROUND OF THE INVENTION

1. Field of the Invention

The present invention relates to the field of microelectronics fabrication. More specifically, the present invention relates to the forming of dielectric layers as insulation for semiconductor microelectronics devices.

2. Description of the Related Art

In the fabrication of semiconductor microelectronics devices employed in modern integrated circuits, it has become critical to reduce the various dimensions of the devices in order to improve performance and reduce cost. In particular, the metal-oxide-silicon (MOS) field-effect transistor (FET) device type has become one of the most important classes of integrated circuits. These MOSFET-type circuits are employed where the greatest circuit density and lowest power dissipation are needed. In order to achieve the utmost advantage of this particular type of device, it is desirable to minimize the dielectric thickness of the gate insulation ("oxide" portion of the MOS structure) over the conductive channel of the device. It has become customary to employ extremely thin layers of silicon oxide formed on silicon to provide this pate insulation, because the thermal oxidation of silicon in appropriate oxidizing ambient environents can be precisely controlled to produce the very thin silicon oxide dielectric layer desired, and additionally to permit the control of the electronics states and electrical charge at the interface between the silicon and the silicon oxide layer.

While layers of silicon oxide as thin as 30–40 angstroms may be utilized for the gate insulation, the reliability and manufacturability of the devices begins to be degraded below this thickness. There are many methods which have been employed to alleviate this natural limit while retaining the advantage of the thermally-grown oxide-silicon. It is the capacitance of the gate insulating layer which actually determines the performance of the MOS device, and the higher capacitance desired could be obtained by a higher dielectric constant material than silicon oxide, which is fairly low at K=3.9. However, attempts to replace silicon oxide directly with a higher dielectric constant material such as, e.g., silicon nitride (K=5.0) have not succeeded due to the difficulty of controlling the interface between the deposited insulator compared with the ease of control of the interface when it is a thermally grown silicon oxide layer. Therefore, many attempts have also been made to employ a composite gate insulator layer consisting of a thermally grown silicon oxide layer on the silicon substrate and a subsequently formed dielectric layer, usually of a higher dielectric constant material.

It is thus towards the goal of forming a gate insulating layer of a MOS device on a silicon substrate with a higher dielectric constant as well as the performance, reliability and manufacturability of thermally grown silicon oxide dielectric layers that the present invention is generally directed.

Various methods have been proposed for forming composite gate insulation dielectric layers on MOS devices, with higher K values than thermally grown silicon oxide dielectric layers.

For example, Tseng et al., in U.S. Pat. No. 5,712,208, disclose a method for forming a high-K dielectric layer on a substrate. The dielectric layer is a composite layer formed of a thin underlying layer with a substantial composition of nitrogen and fluorine, followed by a thermal oxide layer and an overlying deposited dielectric layer. An optional thermal heat cycle may be employed to densify the deposited dielectric layer.

Further, Gilmer et al., in U.S. Pat. No. 5,821,172, disclose a method for forming a silicon oxynitride dielectric layer on a single crystal silicon substrate. The method employs a first first thermal treatment in a $N_2$ or argon atmosphere at between 400 and 700 degrees centigrade, followed by exposure to $NH_3$ combined with either NO or $N_2O$ at 600 to 1100 degrees centigrade to form an oxynitride layer.

Still further, Doyle et al., in U.S. Pat. No. 5,891,798, disclose a method for forming a composite dielectric layer with a high dielectric constant on silicon. The method employs nitrogen implantation into silicon through a sacrifical surface layer of silicon oxide. After annealing and stripping the sacrificial silicon oxide layer, a high dielectric constant material such as a paraelectric material is deposited on the substrate.

Finally, Brady et al., in U.S. Pat. No. 5,940,736, disclose a method for forming a gate dielectric layer of silicon oxynitride on a silicon semiconductor substrate. The method employs a three-step process of growing, depositing and growing silicon oxide under low pressure (0.2 to 10 torr). At each step, $N_2O$ or NO may be employed in the oxidizing gas for light nitrogen incorporation and formation of silicon oxynitride from the silicon oxide dielectric layer.

Desirable in the field of microelectronics fabrication of MOS devices are additional methods for forming gate insulating layers with the properties of high dielectric constant combined with high performance, reliability and manufacturability.

It is towards these goals that the present invention is generally and specifically directed.

SUMMARY OF THE INVENTION

A first object of the present invention is to provide a method for forming upon a semiconductor substrate employed within a microelectronics fabrication a layer of dielectric material comprising a thermally grown silicon oxide layer and a high-K dielectric material.

A second object of the present invention is to provide a method in accord with the first object of the present invention, where the layer of dielectric material is a gate insulation layer of a MOS device formed employing a plasma method to convert part of the silicon oxide to a silicon nitride dielectric layer to provide a composite dielectric layer equivalent dielectrically to the original silicon oxide dielectric layer.

A third object of the present invention is to provide a method in accord with the first object of the present invention and the second object of the present invention, where the composite gate dielectric materials of the gate insulating layer of a MOS device have the desirable performance, reliability and manufacturability of MOS devices employing thermally grown silicon oxide dielectric layers as gate insulation.

A fourth object of the present invention is to provide a method in accord with the first object of the present invention, the second object of the present invention, and/or the third object of the present invention, where the method is readily commercially implemented.

In accord with the objects of the present invention, there is provided a method for forming, upon a semiconductor substrate employed within a microelectronics fabrication, a composite dielectric layer comprising a thermally grown silicon oxide dielectric layer and a subsequently formed high-K dielectric layer. To practice the invention, there is first provided a silicon semiconductor substrate. There is then formed upon the silicon semiconductor substrate a silicon oxide dielectric layer employing a thermal oxidation method. There is then formed upon and partly into the silicon oxide dielectric layer a layer of silicon nitride employing a plasma deposition method to convent some of the silicon oxide to silicon nitride and retain the total dielectric thickness of the original silicon oxide dielectric layer. A subsequent layer of optional additional high-K dielectric material may then be deposited over the composite silicon oxide-silicon nitride dielectric layer if additional capacitance is desired.

The present invention provides a method for forming a composite gate insulating dielectric layer upon a semiconductor silicon substrate with an equivalent dielectric thickness of a thermally grown silicon oxide dielectric layer but with an additional layer of silicon nitride high-K dielectric material to provide performance, reliability and manufacturability.

The present invention employs materials and methods which are known in the art of microelectronics fabrication, but in a novel order and sequence. Therefore the present invention is readily commercially implemented.

BRIEF DESCRIPTION OF THE DRAWINGS

The objects, features and advantages of the present invention are understood within the context of the Description of the Preferred Embodiment as set forth below. The description of the Preferred Embodiment is understood within the context of the accompanying drawing, which forms a material part of this disclosure, wherein:

FIGS. 1 to 4 illustrate the formation upon a semiconductor substrate employed within a microelectronics fabrication of a composite gate insulation dielectric layer.

DESCRIPTION OF THE PREFERRED EMBODIMENT

The present invention provides a method for forming upon a semiconductor substrate employed within a microelectronics fabrication a composite gate insulation dielectric layer which is dielectrically equivalent to a thermally grown silicon oxide dielectric layer, but with a higher dielectric constant and with equivalent performance, reliability and manufacturability.

Figure 1:
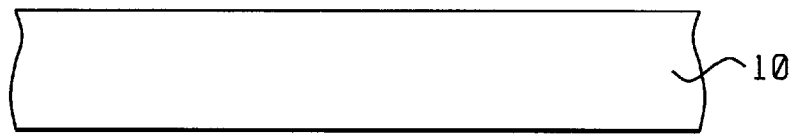
FIG. 1, FIG. 2, FIG. 3 and FIG. 4 are directed towards a general embodiment of the present invention which represents a preferred embodiment of the present invention.

Referring now to FIG. 1 to FIG. 4, there is shown a series of schematic cross-sectional diagrams illustrating the results of forming upon a silicon semiconductor substrate employed within a microelectronics fabrication a composite gate insulation dielectric layer dielectrically equivalent to a thermally grown silicon oxide dielectric layer, but with a higher dielectric constant and equivalent performance, reliability and manufacturability. FIG. 1 is a schematic cross-sectional diagram of a microelectronics fabrication at an early stage in its fabrication in accord with the preferred embodiment of the present invention.

Shown in FIG. 1 is a semiconductor substrate 10 employed within a microelectronics fabrication. Preferably the semiconductor substrate 10 is a silicon semiconductor substrate itself employed within a microelectronics fabrication. The silicon substrate 10 is employed within a microelectronics fabrication chosen from the group including but not limited to integrated circuit microelectronics fabrications, charge coupled device microelectronics fabrications, radiation emitting microelectronics fabrications, and optoelectronics microelectronics fabrications.

Figure 2:
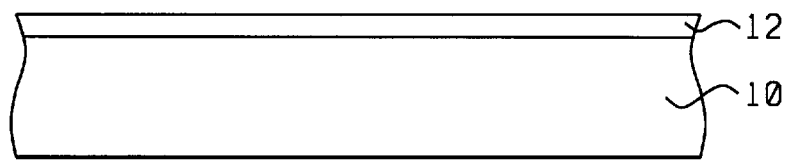

Referring now more particularly to FIG. 2, there is shown a schematic cross-sectional diagram illustrating the results of further processing of the microelectronics fabrication whose schematic cross-sectional diagram is shown in FIG. 1 in accord with the preferred embodiment of the present invention. Shown in FIG. 2 is a microelectronics fabrication otherwise equivalent to the microelectronics fabrication shown in FIG. 1, but where there has been formed over the silicon substrate 10 a layer of silicon oxide dielectric material 12 employing an oxidizing environment 14.

With respect to the layer of silicon oxide dielectric material 12 shown in FIG. 2, the layer of silicon oxide dielectric material 12 is formed to a thickness of about 5 to about 10 angstroms employing thermal oxidation at a temperature of from about 500 to about 800 degrees centigrade in an oxidizing environment of a mixture of oxygen and nitrogen gases 14.

Figure 3:
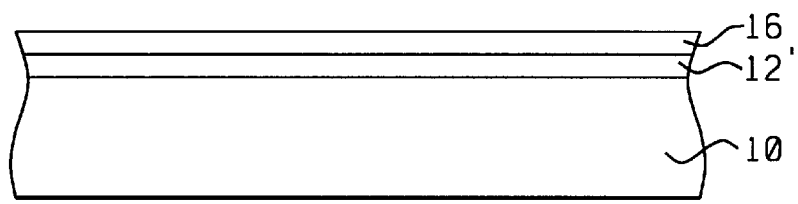

Referring now more particularly to FIG. 3, there is shown a schematic cross-sectional diagram illustrating the results of further processing of the microelectronics fabrication whose schematic cross-sectional diagram is shown in FIG. 2. Shown in FIG. 3 is a microelectronics fabrication otherwise equivalent to the microelectronics fabrication shown in FIG. 2, but where there has been formed a layer of high-K dielectric material 16 partly consuming the silicon oxide dielectric layer and leaving a remaining silicon oxide dielectric layer 12'. The high-K dielectric layer has been formed employing chemical vapor deposition (CVD) sputtering remote plasma nitridation (RPN) method 18.

With respect to the high-K dielectric layer 16 shown in FIG. 3, the high-K dielectric layer is preferably a layer of silicon nitride formed partly from the silicon oxide dielectric layer 12, leaving a remaining layer of silicon oxide dielectric material 12' such that the final thickness of the composite dielectric layer comprising the remaining silicon oxide layer 12' and the silicon nitride layer 16 together have a dielectric thickness $T_{eq}$ given by:

$$T_{eq} = T_{(SiO2)} + T_{(high-K)}/(high-k)3.9$$

where $T_{(SiO2)}$ is the thickness of silicon oxide dielectric layer, $T_{(high-k)}$ is the thickness of the high-K dielectric layer. $_{(high-k)}$ is the dielectric constant of the high-K dielectric layer and 3.9 is the dielectric constant of silicon oxide dielectric layer.

With respect to the remote plasma nitridation (RTP) chemical vapor deposition (CVD) method 18, the RTP chemical vapor deposition (CV D) sputtering method 18 preferably employs a microwave power input to sustain the plasma. The plasma activates nitrogen species which partially converts the silicon oxide layer 12 to a high-K dielectric layer 16 and a remaining silicon oxide layer 12' to provide the total dielectric layer thickness $T_{eq}$.

Figure 4:
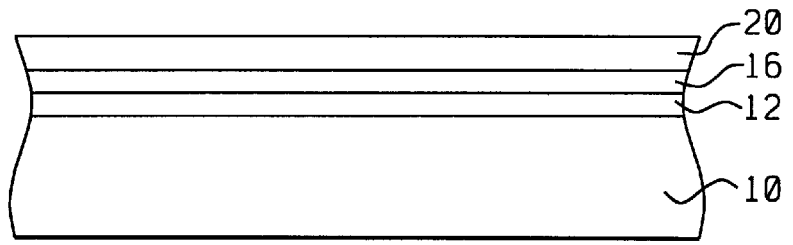

Referring now more particularly to FIG. 4, there is shown a schematic cross-sectional diagram illustrating the final result of further processing of the microelectronics fabrication whose schematic cross-sectional diagram is shown in FIG. 3. Shown in FIG. 4 is a microelectronics fabrication otherwise equivalent to the microelectronics fabrication shown in FIG. 3, but where there has been formed an optional additional dielectric layer 20 over the silicon semiconductor substrate 10.

With respect to the optional additional dielectric layer 20, the optional additional dielectric layer 20 is a high-K dielectric material formed employing high-K materials known in the art of microelectronics fabrication including but not limited to inorganic dielectric materials such as silicon nitride, aluminum oxide and various titanate compounds and organic high-K dielectric materials such as guanidinium aluminum sulfate hydrate (GASH), employing methods including but not limited to chemical vapor deposition, sputtering, and anodization which are known in the art of microelectronics fabrication.

The present invention provides a method for forming upon a silicon substrate employed within a microelectronics fabrication a composite gate insulation layer comprising a layer of silicon oxide dielectric material formed by thermal oxidation of the silicon substrate, and a layer of high-K dielectric material formed by plasma deposition method. Additional high-K dielectric material may be formed over the substrate if desired. The composite dielectric layer employed provides a dielectrically equivalent gate insulation layer suitable for MOS devices affording the performance, reliability and manufacturability of thermally grown silicon oxide gate insulating layer.

The control of the process parameters for achieving precise values of equivalent silicon oxide dielectric layer thickness is achieved by proper timing of the various process steps and by precise control of the temperature ranges. The optional additional high-K dielectric material affords a greater physical thickness of total dielectric material which improved device reliability while retaining device performance due to the higher dielectric constant of the total dielectric layer.

As is understood by a person skilled in the art, the preferred embodiment of the present invention is illustrative of the present invention rather than limiting of the present invention. Revisions and modifications may be made to materials, structures and dimensions through which is provided the preferred embodiment of the present invention while still providing embodiments which are within the spirit and scope of the present invention, as defined by the appended claims.

What is claimed is:

1. A method for forming upon a semiconductor substrate employed within a microelectronics fabrication a composite dielectric layer comprising:

providing a silicon semiconductor substrate employed within a microelectronics fabrication;

thermally oxidizing said silicon semiconductor substrate to form a silicon oxide dielectric layer;

forming upon the surface of the silicon oxide dielectric layer a first layer of silicon nitride high-K dielectric material employing remote plasma nitridation (RPN) method such that the composite dielectric layer is dielectrically equivalent to the said initial silicon oxide dielectric layer; and forming an optional additional layer of high-K dielectric material over the substrate.

2. The method of claim 1 wherein the thermal oxidation of said silicon semiconductor substrate employs a mixture of oxygen and nitrogen gases as the oxidizing atmosphere at a temperature range of from about 500 to about 800 degrees centigrade.

3. The method of claim 1 wherein the remote plasma nitridation (RPN) chemical vapor deposition (CVD) method employs microwave generation of a plasma in nitrogen gas to form active nitrogen radicals to convert part of the silicon oxide dielectric layer to silicon nitride high-K dielectric layer.

4. The method of claim 1 wherein the initial silicon oxide dielectric layer thickness is from about 5 to about 10 angstroms.

5. The method of claim 1 wherein the optional additional high-K dielectric material thickness is from about 20 to about 50 angstroms.

6. The method of claim 1 where the final remaining silicon oxide dielectric layer thickness is from zero to about 5 angstroms.

7. The method of claim 1 wherein said microelectronics fabrication is chosen from the group including but not limited to:

integrated circuit microelectronics fabrications;

charge coupled device microelectronics fabrications;

radiation emitting microelectronics fabrications; and optoelectronics microelectronics fabrications.

8. A method for forming upon a silicon semiconductor substrate employed within an integrated circuit microelectronics fabrication a composite dielectric layer comprising providing a silicon semiconductor substrate employed within an integrated circuit microelectronics fabrication;

forming upon said silicon substrate an initial silicon oxide dielectric layer;

forming upon the silicon substrate partly within the silicon oxide dielectric layer a first layer of silicon nitride high-K dielectric material such that the resulting composite dielectric layer is dielectrically equivalent to said initial silicon oxide dielectric layer; and forming over the silicon semiconductor substrate an optional additional layer composed of silicon nitride high-K dielectric material.

9. The method of claim 8 wherein the initial silicon oxide dielectric layer is formed by the method of thermal oxidation employing a mixture of oxygen and nitrogen gases at a temperature of from about 500 to about 800 degrees centigrade in an oxidation apparatus.

10. The method of claim 8 wherein the initial silicon oxide dielectric layer thickness is from about 5 to about 10 angstroms.

11. The method of claim 8 a herein the first layer of silicon nitride high-KI dielectric material is formed employing remote plasma nitridation (RPN) chemical vapor deposition (CVD) method with microwave power.

12. The method of claim 11 wherein the first layer of silicon nitride high-K dielectric material is formed to a thickness of from about 10 to about 50 angstroms.

13. The method of claim 8 wherein the composite gate insulation layer of remaining silicon de dielectric material and silicon nitride high-K dielectric material is dielectrically equivalent to the initial silicon oxide dielectric layer.

14. The method of claim 8 wherein the composite gate insulation layer provides equivalent performance, reliability and manufacturability to the initial silicon oxide dielectric gate insulation layer.

15. The method of claim 8 wherein the optional additional layer of high-K material is chosen the group consisting of:

inorganic high-K dielectric materials; and organic high-K dielectric materials.

* * * * *